(12) United States Patent
Liu et al.

(10) Patent No.: US 7,645,624 B2
(45) Date of Patent: Jan. 12, 2010

(54) METHOD FOR SELF BONDING EPITAXY

(75) Inventors: Yu-Chuan Liu, Taoyuan County (TW); Hung-Cheng Lin, Taipei County (TW); Wen-Chieh Hsu, Taoyuan County (TW); Chia-Ming Lee, Yilan County (TW); Jenn-Hwa Fu, Chiayi (TW)

(73) Assignee: Tekcore Co., Ltd., Nantou (TW)

( * ) Notice: Subject to any disclaimer, the term of this patent is extended or adjusted under 35 U.S.C. 154(b) by 260 days.

(21) Appl. No.: 11/980,472

(22) Filed: Oct. 31, 2007

(65) Prior Publication Data

US 2009/0111202 A1    Apr. 30, 2009

(51) Int. Cl.
*H01L 21/00* (2006.01)
*H01L 21/76* (2006.01)
(52) U.S. Cl. .................. 438/32; 438/430; 257/E21.578
(58) Field of Classification Search .................... 438/32, 438/455, 424, 430; 257/E21.578
See application file for complete search history.

(56) References Cited

U.S. PATENT DOCUMENTS

| | | | | |
|---|---|---|---|---|
| 5,633,193 A | * | 5/1997 | Baillargeon et al. ........... 438/32 |
| 5,981,360 A | * | 11/1999 | Rabarot et al. ............... 438/455 |
| 6,114,221 A | * | 9/2000 | Tonti et al. .................... 438/455 |
| 6,888,214 B2 | * | 5/2005 | Mouli et al. ................. 257/510 |
| 7,439,155 B2 | * | 10/2008 | Mouli et al. ................. 438/429 |
| 2005/0189315 A1 | * | 9/2005 | Knight et al. .................. 438/32 |
| 2006/0043525 A1 | * | 3/2006 | Mouli ......................... 257/520 |
| 2006/0205176 A1 | * | 9/2006 | Butzek et al. ............... 438/455 |
| 2008/0020546 A1 | * | 1/2008 | Cooney et al. .............. 438/455 |

* cited by examiner

*Primary Examiner*—Walter L Lindsay, Jr.
(74) *Attorney, Agent, or Firm*—Muncy, Geissler, Olds & Lowe, PLLC

(57) ABSTRACT

A method for self bonding epitaxy includes forming a passivation layer on a substrate surface of a semiconductor lighting element; etching to form recesses and protrusive portions with the passivation layer located thereon; starting forming epitaxy on the bottom surface of the recesses; filling the recesses with an Epi layer; then covering the protrusive portions and starting self bonding upwards the epitaxy to finish the Epi layer structure. Such a self bonding epitaxy growing technique can prevent cavity generation caused by parameter errors of the epitaxy and reduce defect density, and improve the quality of the Epi layer and increase internal quantum efficiency.

8 Claims, 6 Drawing Sheets

METHOD FOR SELF BONDING EPITAXY

FIELD OF THE INVENTION

The present invention relates to a semiconductor lighting element and particularly to a method for forming an Epi layer of semiconductor lighting elements through self bonding epitaxy.

BACKGROUND OF THE INVENTION

Conventional semiconductor lighting elements are made in a standard rectangular profile. As the general semiconductor material has a refractive index greatly different from the package material, total reflective angle is smaller. Hence when the light generated by the semiconductor lighting elements reaches the critical surface with air the light greater than the critical angle generates total reflection and returns to the crystals on the lighting elements. In addition, the rectangle has four parallel cross sections. The probability of protons leaving the semiconductor at the interface is smaller. The protons can only be totally reflected until fully absorbed. The light is converted to heat. As a result, light generation effect is not desirable.

Changing light reflection is an effective way to improve light generation efficiency. The present approach is forming a recess 11 and a protrusive portion 12 at the surface of a substrate 10 to generate light scattering or diffraction on the lighting area (referring to FIG. 1) to increase external quantum efficiency and enhance light generating efficiency.

However, the structure of the recess 11 and protrusive portion 12 also makes manufacturing of the epitaxy in the follow-on process more difficult. It generally requires to control the epitaxy in a desired condition to get a cavity-free semiconductor layer to enhance light generating efficiency. But the epitaxy parameters such as temperature, pressure, gas flow, V/III flux ratio and dopant content affect transverse and lateral growing speed of the epitaxy. Referring to FIG. 2, while an Epi layer 20 starts to form epitaxy on a bottom surface 13 of the recess 11 and a flat surface 14 at an upper side of the protrusive portion 12 the lateral growing speed of the Epi layer 20 on the protrusive portion 12 is greater than the lateral growing speed of the recess 11, hence squeezing takes place between them and cavities 21 occur after the Epi layer 20 is formed (referring to FIG. 3). These cavities 21 cause light loss in the semiconductor lighting element and reduce internal quantum efficiency. As a result lighting efficiency and life span of the lighting element suffer.

SUMMARY OF THE INVENTION

In order to solve the aforesaid disadvantages it is an object of the present invention to provide a method for self bonding epitaxy to prevent cavity generation during growing of the epitaxy caused by parameter errors, reduce defect density, improve the quality of Epi layer and increase internal quantum efficiency.

Another object of the invention is to provide an Epi layer with self-bonding epitaxy to be used on lighting elements to prevent cavity generation resulting from parameter errors of the epitaxy to increase production yield and enhance light generating efficiency and life span of the lighting elements.

The method according to the invention aims to form a plurality of recesses and protrusive portions on the surface of a substrate to produce light scattering or diffraction. The method includes: forming a passivation layer which includes silicon dioxide ($SiO_2$) on the surface of the substrate; defining an etching zone for the recesses; etching the substrate; forming a plurality of recesses on the etching zone with a sloped surface formed with natural crystal lattices and a bottom surface, and the protrusive portions with a flat surface and the passivation layer on an upper side; and forming an Epi layer on the bottom surface of the recesses. The Epi layer first fills the recesses, then covers the protrusive portions to start self-bonding epitaxy upwards to finish the Epi layer structure.

The substrate is selected from sapphire, SiC, Si, GaAs or AlN. The Epi layer is made from a family group consisting of GaN, InGaN, AlGaN, InAlGaN and GaNp.

The recesses may be formed in rectangular, circular, triangular, star shape or polygonal. The edge of the recesses and protrusive portions is between 0.01 μm and 100 μm. The depth of the recesses is between 0.01 μm and 100 μm.

The invention also provides an extended etching period during the etching process until the recesses at the etching zone are etched with the sloped and bottom surfaces of natural crystal lattices, and the protrusive portions formed with pointed cross sections to become pointed protrusive portions. Then the passivation layer is removed. Afterward, the Epi layer starts to grow at the bottom surface of the recesses. The Epi layer first fills the recesses, then covers the pointed protrusive portions to start self-bonding upwards to finish the Epi layer structure.

The invention provides many advantages, such as by forming the recesses with a natural crystal lattice sloped pattern on the substrate through the etching technique, and selectively growing an Epi layer of the semiconductor lighting element on the bottom surface of the recesses, a self-bonding epitaxy can be produced. Cavity can be prevented during growing of the epitaxy resulting from parameter errors of the epitaxy, and defect density can be reduced, and the quality of the Epi layer improves. As a result internal quantum efficiency increases, and light generating efficiency and life span of the lighting element improve. Moreover, the manufacturing process of the invention is simpler. Production cost is lower. It is adaptable for mass production.

The foregoing, as well as additional objects, features and advantages of the invention will be more readily apparent from the following detailed description, which proceeds with reference to the accompanying drawings. The embodiments discussed below serve only for illustrative purpose and are not the limitation of the invention.

DETAILED DESCRIPTION OF THE PREFERRED EMBODIMENTS

The invention aims to deploy substrate etching technique to form recesses on a substrate of semiconductor lighting elements with natural crystal lattice sloped patterns so that lighting zones are formed with recesses and protrusive portions to generate light scattering or diffraction to increase external quantum efficiency and improve light generating rate.

Figure 1:
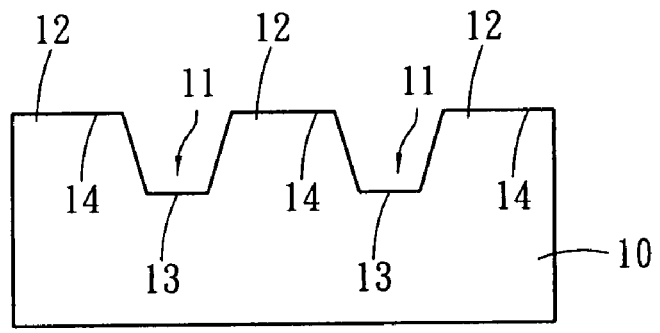
FIG. 1 is a schematic view of a conventional substrate with recesses and protrusive portions formed thereon.
Figure 2:
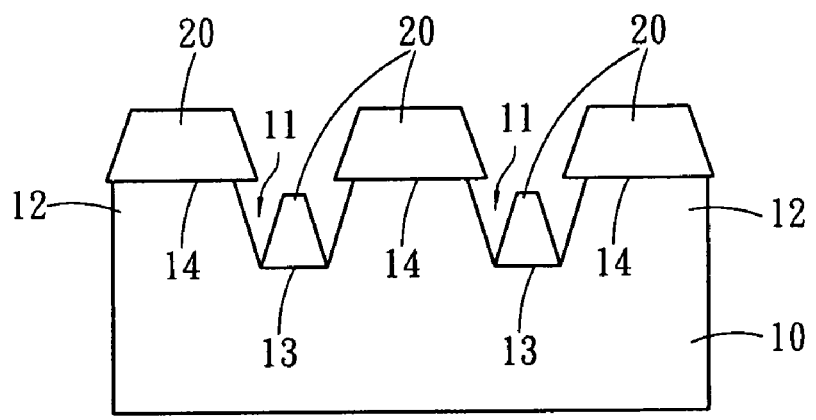
FIG. 2 is a schematic view for forming epitaxy on the surface of a conventional substrate
Figure 3:
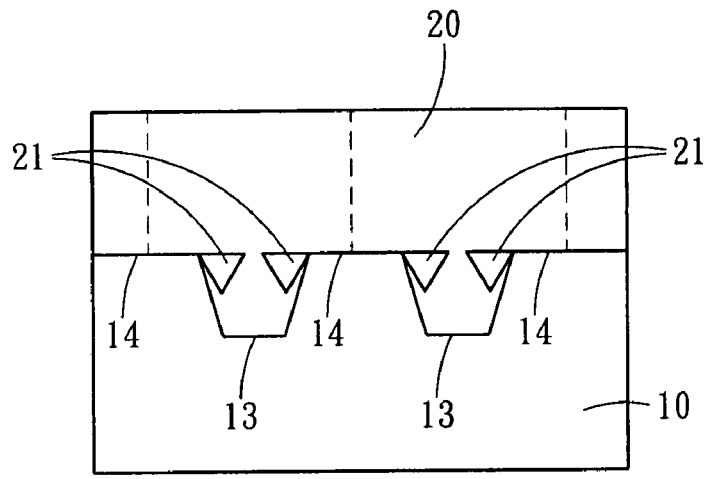
FIG. 3 is a schematic view of a conventional substrate with epitaxy formed on surface.
Figure 4:
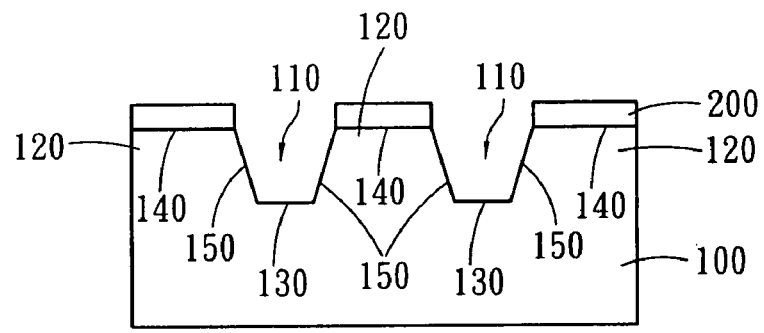
FIG. 4 is a schematic view of the invention with recesses and protrusive portions formed on the substrate surface.

The invention provides a method for forming epitaxy by producing a plurality of recesses 110 and protrusive portions 120 on the surface of a substrate 100 to generate light scattering or diffraction. Referring to FIG. 4, the method according to the invention includes: forming a passivation layer 200 on the surface of the substrate 100 to define etching zones of the recesses 110. The substrate 100 may be made from sapphire, SiC, Si, GaAs or AlN. The passivation layer 200 includes $SiO_2$. Then etch the substrate 100 to form a plurality of the recesses 110 on the etching zones consisting of a natural crystal lattice sloped surface 150 and bottom surface 130, and the protrusive portions 120 with a flat surface 140 at an upper side holding the passivation layer 200. The recesses 110 may be formed in rectangular, circular, triangular, star shape or polygonal. The edge between the recesses 110 and protrusive portions 120 is between 0.01 μm and 100 μm. The depth of the recesses 110 is between 0.01 μm and 100 μm.

In recent years the technique of sapphire substrate is well developed, and etching the sapphire substrate is an established process. The invention deploys the etching technique to form the recesses 110 with a natural crystal lattice sloped surface pattern on the sapphire substrate. A wet etching solution is used, consisting of sulfuric acid and phosphoric acid at a ratio of 5:2. Upon heating to 270° C. the sapphire substrate can be etched. When the passivation layer 200 is in the direction parallel with the straight side of the sapphire substrate a symmetrical composite bonding surface can be formed by etching. The composite bonding surface has the sloped surface 150 forming an angle about 43° with a bottom surface 130. When the passivation layer 200 is perpendicular to the straight side of the sapphire substrate, a natural crystal lattice sloped surface can be formed by etching. The natural crystal lattice sloped surface 150 forms an angle about 32° with the bottom surface 130. The composite crystal lattice sloped surface, and the composite surface of the sloped surface 150 and bottom surface 130 form an angle about 60°.

Figure 5A:
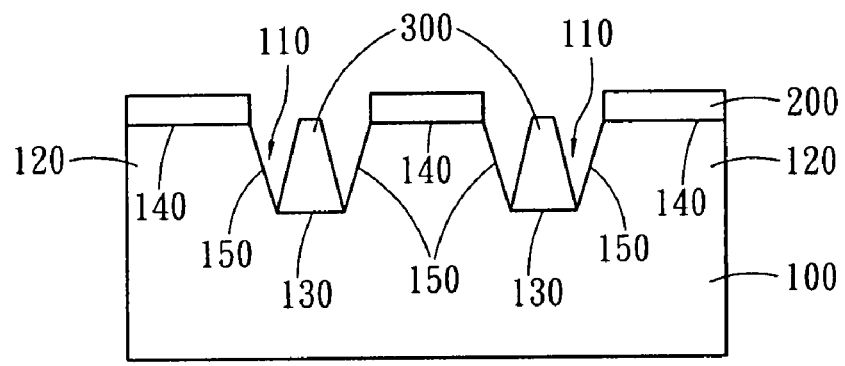
FIGS. 5A and 5B are schematic views showing the process of forming epitaxy on the substrate surface according to FIG. 4.
Figure 5B:
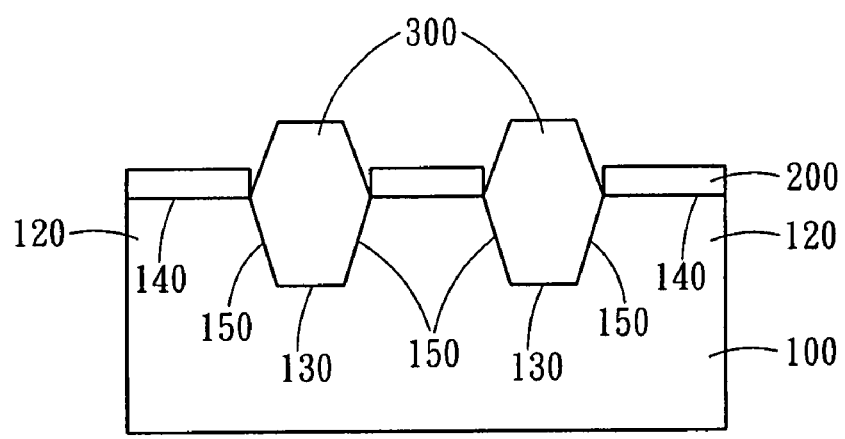
Figure 6:
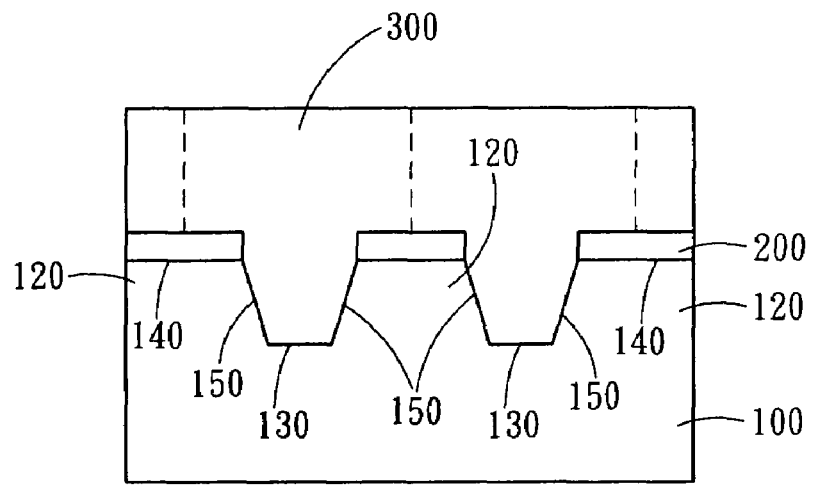
FIG. 6 is a schematic view of the structure with the epitaxy formed on the substrate surface according to FIG. 4.

Referring to FIGS. 5A and B, on the bottom surface 130 of the recesses 110 an Epi layer 300 starts to form (referring to FIG. 5A). The Epi layer is made from the one of the families consisting of GaN, InGaN, AlGaN, InAlGaN and GaNP. The Epi layer 300 selectively grows on the bottom surface 130 of the recesses 110 without growing on the sloped surface 150 or on the passivation layer 200 above the protrusive portions 120. Hence the Epi layer 300 first steadily grows and fills the recesses 110 (referring to FIG. 5B), then covers the protrusive portions 120, and starts self bonding upwards to finish the Epi layer 300 structure (referring to FIG. 6).

Figure 7:
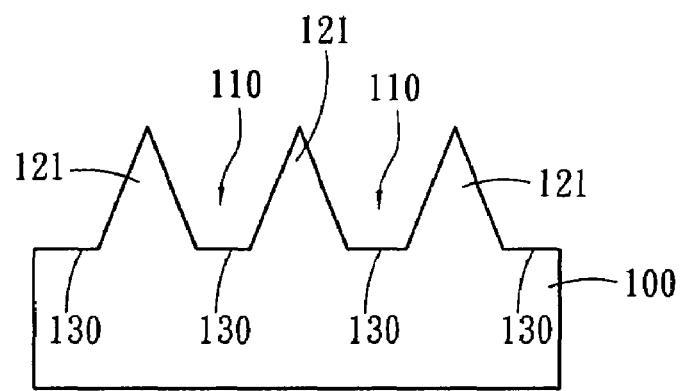
FIG. 7 is a schematic view of a substrate surface with pointed protrusive portions formed thereon.
Figure 8A:
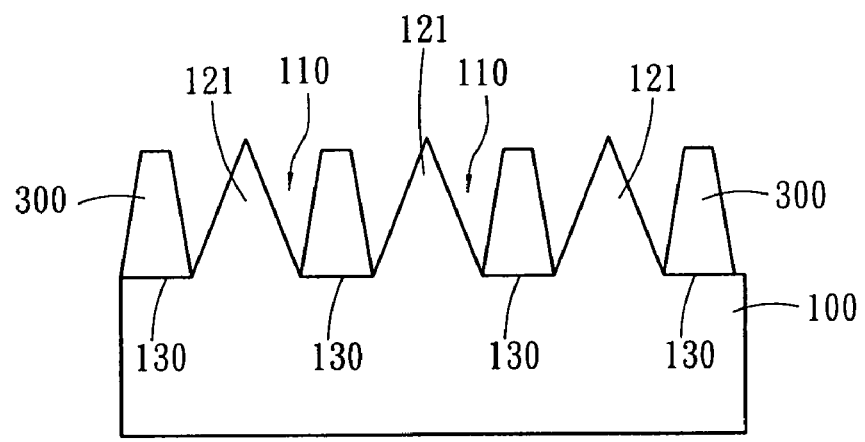
FIGS. 8A and 8B are schematic views showing the process of forming epitaxy on the substrate surface according to FIG. 7.
Figure 8B:
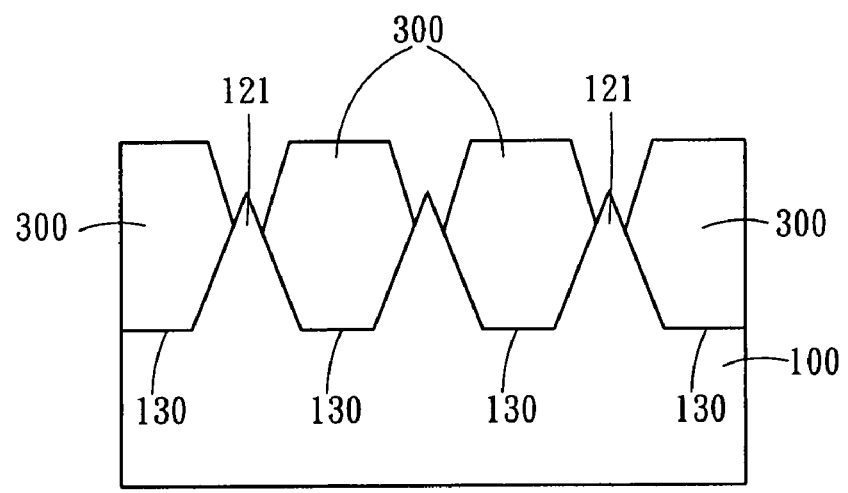
Figure 9:
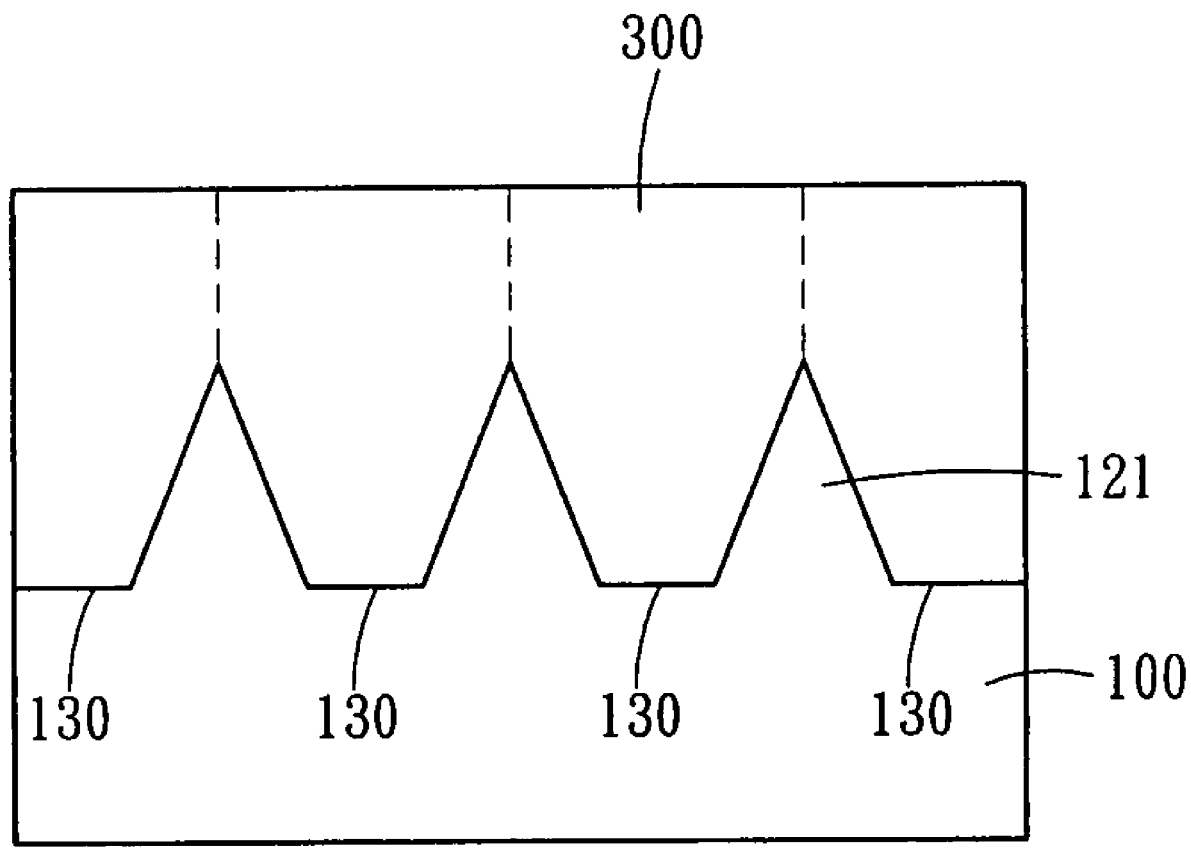
FIG. 9 is a schematic view of the structure with the epitaxy formed on the substrate surface according to FIG. 7.

The invention also may increase the etching time of the substrate 100 until the passivation layer 200 is removed. Referring to FIG. 7, by increasing the etching time of the substrate 100 a plurality of the recesses 110 with the natural crystal lattice sloped surface 150 and the bottom surface 130 can be formed by etching on the etching zone with a pointed cross section formed on the protrusive portions 120 to become pointed protrusive portions 121 until the passivation layer 200 is removed (referring to FIG. 8A). The Epi layer 300 selectively grows on the bottom surface 130 without growing on the sloped surface 150 or on the pointed protrusive portions 121. Hence the Epi layer 300 first steadily grows and fills the recesses 110 (referring to FIG. 8B), then covers the pointed protrusive portions 121, and starts self bonding upwards to finish the Epi layer 300 structure (referring to FIG. 9).

The self bonding epitaxy technique of the invention can prevent cavity generation caused by epitaxy parameter errors during growing of the epitaxy and reduce defects, and improve the quality of the Epi layer and increase internal quantum efficiency. As a result light generating efficiency of the lighting element improves and life span of the lighting element is longer. Moreover, the manufacturing process of the invention is simpler. Thus production cost is lower. It is adaptable to mass production.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A method for self bonding epitaxy to form recesses and protrusive portions for light scattering or diffraction on the surface of a substrate of a semiconductor lighting element, comprising:

forming a passivation layer on the substrate surface and defining etching zones for forming the recesses;

etching the substrate on the etching zones to form a plurality of the recesses which have a natural crystal lattice sloped surface and a bottom surface, and the protrusive portions which have a flat surface at an upper side covered by the passivation layer; and starting forming an Epi layer on the bottom surface of the recesses to fill the recesses then cover the protrusive portions, and starting self bonding upwards of the epitaxy to finish the Epi layer structure.

2. The method of claim 1, wherein the substrate is selected from the group consisting of sapphire, SiC, Si, GaAs, and AlN.

3. The method of claim 1, wherein the passivation layer includes $SiO_2$.

4. The method of claim 1, wherein the recesses are formed in a shape of rectangle, circle, triangle, start shape or polygon.

5. The method of claim 1, wherein the recesses and the protrusive portions are formed with an edge between 0.01 μm and 100 μm.

6. The method of claim 1, wherein the recesses are formed at a depth between 0.01 μm and 100 μm.

7. The method of claim 1, wherein the Epi layer is made from a material selected from the group consisting of families of GaN, InGaN, AlGn, InAlGaN and GaNP.

8. The method of claim 1, wherein the time of the etching is increased until the cross section of the protrusive portions becomes pointed to form a plurality of pointed protrusive portions and the passivation layer is removed.

* * * * *